(12) United States Patent
Jeong

(10) Patent No.: US 8,183,589 B2
(45) Date of Patent: May 22, 2012

(54) SUBSTRATE FOR FABRICATING LIGHT EMITTING DEVICE AND METHOD FOR FABRICATING THE LIGHT EMITTING DEVICE

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/953,775

(22) Filed: Nov. 24, 2010

(65) Prior Publication Data

US 2011/0220938 A1 Sep. 15, 2011

(30) Foreign Application Priority Data

Mar. 9, 2010 (KR) ........................ 10-2010-0020648

(51) Int. Cl.
*H01L 33/00* (2010.01)
(52) U.S. Cl. ........... 257/98; 257/E33.074; 257/E21.211; 438/29
(58) Field of Classification Search .................... 257/98, 257/E33.074, E21.211; 438/29
See application file for complete search history.

(56) References Cited

U.S. PATENT DOCUMENTS

| 7,550,776 B2 * | 6/2009 | Akita ............................ 257/96 |
| 2005/0247950 A1 * | 11/2005 | Nakamura et al. ............. 257/98 |
| 2008/0054296 A1 | 3/2008 | Yoon et al. |
| 2008/0258133 A1 | 10/2008 | Seong |
| 2011/0140076 A1 * | 6/2011 | Song ............................... 257/13 |
| 2011/0204325 A1 * | 8/2011 | Kim ................................ 257/13 |

FOREIGN PATENT DOCUMENTS

| JP | 07-235690 A | 9/1995 |
| JP | 2000-261088 A | 9/2000 |
| KR | 10-2007-0089763 A | 9/2007 |
| KR | 10-0843408 B1 | 7/2008 |
| KR | 10-2009-0096759 A | 9/2009 |

* cited by examiner

*Primary Examiner* — Trung Q Dang
(74) *Attorney, Agent, or Firm* — McKenna Long & Aldridge LLP

(57) ABSTRACT

Provided is a substrate for fabricating a light emitting device and a method for fabricating the light emitting device. The method for fabricating the light emitting device may include forming a sacrificial layer having band gap energy less than energy of a laser irradiated on a substrate, forming a growth layer on the sacrificial layer, forming a light emitting structure including a first conductive type semiconductor layer, an active layer, and a second conductive type semiconductor layer on the growth layer, and irradiating the laser onto the sacrificial layer to pass through the substrate, thereby to lift-off the substrate.

16 Claims, 11 Drawing Sheets

SUBSTRATE FOR FABRICATING LIGHT EMITTING DEVICE AND METHOD FOR FABRICATING THE LIGHT EMITTING DEVICE

CROSS-REFERENCE TO RELATED APPLICATIONS

The present application claims priority under 35 U.S.C. §119(a) of Korean Patent Application No. 10-2010-0020648 filed on Mar. 9, 2010, which is hereby incorporated by reference in its entirety as if fully set forth herein.

BACKGROUND

Embodiments relate to a substrate for fabricating a light emitting device and a method for fabricating the light emitting device.

A light emitting diode (LED) is a kind of a semiconductor device for converting electric energy into light. The LED has advantages such as low power consumption, a semi-permanent life cycle, a fast response time, safety, and environment friendliness compared to the related art light source such as a fluorescent lamp and an incandescent bulb. Many studies are in progress searching to replace the related art light sources with an LED. Also, the LED is increasingly used as light sources in lighting devices such as a variety of lamps and streetlights, a lighting unit of a liquid crystal display device, and a scoreboard in indoor and outdoor places.

SUMMARY

Exemplary embodiments provide a substrate for fabricating a light emitting device having improved reliability and a method for fabricating the light emitting device.

Exemplary embodiments also provide a substrate for fabricating a light emitting device, which can easily lift-off the substrate.

Exemplary embodiments also provide a substrate for fabricating a light emitting device, which can easily manufacture a light emitting structure.

In one embodiment, a method for fabricating a light emitting device includes: forming a sacrificial layer having band gap energy less than energy of a substrate on the substrate; forming a growth layer on the sacrificial layer; forming a light emitting structure including a first conductive type semiconductor layer, an active layer, and a second conductive type semiconductor layer on the growth layer; and irradiating the laser onto the sacrificial layer to pass through the substrate, thereby to lift-off the substrate.

In another embodiment, a substrate for fabricating a light emitting device includes: a substrate; a sacrificial layer having band gap energy less than energy of the substrate used for removing the substrate; a growth layer on the sacrificial layer; and a light emitting structure including a first conductive type semiconductor layer, an active layer, and a second conductive type semiconductor layer on the growth layer.

The details of one or more embodiments are set forth in the accompanying drawings and the description below. Other features will be apparent from the description and drawings, and from the claims.

DETAILED DESCRIPTION OF THE EMBODIMENTS

Figure 1:
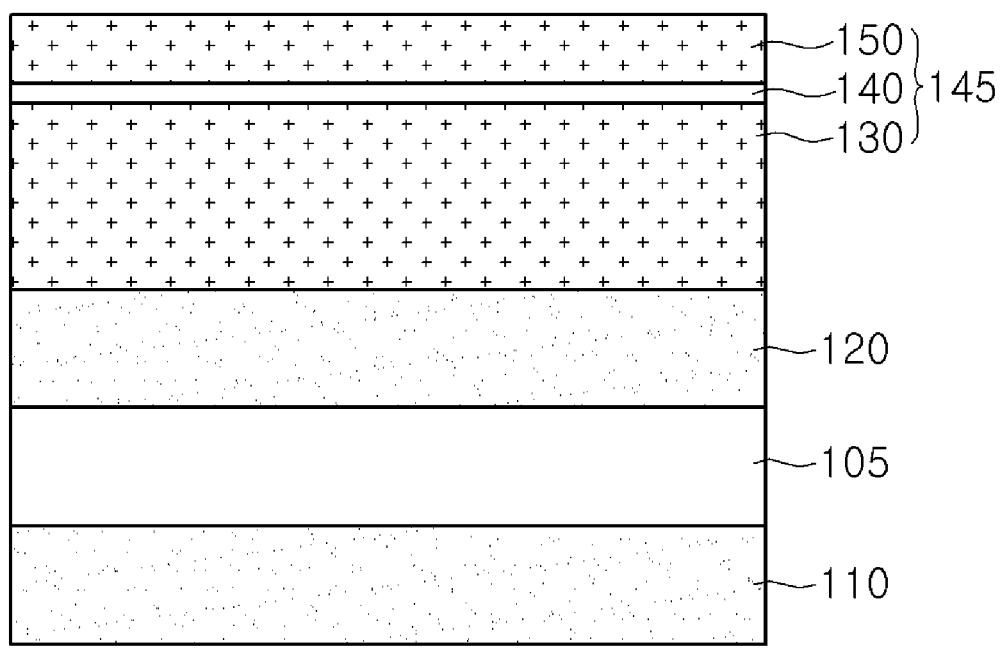
FIG. 1 is a side sectional view of a substrate for fabricating a light emitting device according to an exemplary embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

Hereinafter, embodiments will be described with reference to accompanying drawings. In the drawings, the thickness or size of each layer is exaggerated, omitted, or schematically illustrated for convenience in description and clarity. Also, the size of each element does not entirely reflect an actual size.

FIG. 1 is a side sectional view of a substrate for fabricating a light emitting device according to an exemplary embodiment.

Referring to FIG. 1, a substrate 100 for fabricating a light emitting device according to an embodiment may include a substrate 110, a sacrificial layer 105 on the substrate 110, a growth layer 120 having a poly crystalline structure on the sacrificial layer 105, and a light emitting structure 145 including a first conductive type semiconductor 130, an active layer 140, and a second conductive type semiconductor layer 150 on the growth layer 120 to generate light.

For example, the substrate 110 may include at least one selected from the group consisting of $Al_2O_3$, SiC, GaAs, GaN, ZnO, Si, GaP, InP, and Ge, but is not limited thereto.

The sacrificial layer 105 may be disposed on the substrate 110. For example, the sacrificial layer 105 may have a band gap ranging from about 1.0 eV to about 7.0 eV. For example, the sacrificial layer 105 may include at least one selected from the group consisting of ITO, $Mo_xO_y$, $W_xO_y$, $NiO_x$, $TiO_x$, AlN, and GaN. For example, the sacrificial layer 105 may have a thickness of about 10 nm to about 100 μm, but is not limited thereto.

For example, the sacrificial layer 105 may be formed using one of a sputtering process, an E-beam deposition process, a chemical vapor deposition (CVD) process, and an atomic layer deposition (ALD) process.

The sacrificial layer 105 may be dissolved by energy of a laser used in a laser lift off (LLO) process for laminating the substrate 110.

Thus, when the sacrificial layer 105 has a thickness of greater than about 100 μm, it may take a long time to dissolve the sacrificial layer 105 by irradiation of the laser. Also, when the sacrificial layer 105 has a thickness of less than about 10 μm, it may be difficult to form a layer due to its thin thickness.

The laser may be an excimer laser or a solid state laser, but is not limited thereto. The excimer laser may have a pulse duration of about 10 ns to about 20 ns. In addition, the excimer layer may generate a pulse having strong energy in a range in which pulse repetition is within about 1 Hz to about 500 Hz. Energy per pulse may be about 1 J, and an average power may range from about 20 W to about 100 W, but is not limited thereto.

The sacrificial layer 105 may have band gap energy less than energy of the substrate 110. Thus, when the LLO process is performed, since the sacrificial layer 105 may be dissolved by the energy of the laser, the substrate 110 may be easily lift-off.

Impacts generated by the LLO process and transmitted to the light emitting structure 145 may be minimized by the sacrificial layer 105 and the growth layer 120 between the substrate 110 and the light emitting structure 145 to improve reliability of the fabrication process.

The growth layer 120 may be disposed on the sacrificial layer 105. The growth layer 120 may be formed of a material through which the light emitting structure 145 is easily grown.

For example, the growth layer 120 may be formed using one of the sputtering process, the ALD process, and the E-beam deposition process. For example, the growth layer 120 may be formed of $Al_2O_3$ having a poly crystalline structure. However, to grow the light emitting structure 145 having high quality on the growth layer 120, it may be advantageous that the growth layer 120 has a structure similar to a monocrystalline structure. Thus, after the growth layer 120 is formed, the growth layer 120 may be heat-treated at a high temperature of about 900° C. to about 1100° C. to improve crystallinity of the growth layer 120, but is not limited thereto. The heat-treatment may be performed in at least one atmosphere of nitrogen, oxygen, hydrogen, and ammonia atmosphere.

The growth layer 120 may have a thickness of about 10 nm to about 100 μm, particularly, about 100 nm to about 10 μm. Since the growth layer 120 having the thickness within the foregoing range can be easily removed by an etching process, processability may be improved.

A top surface of the growth layer 120 may be vertically patterned or inclinedly patterned to effectively grow the light emitting structure 145.

A buffer layer (not shown) may be disposed on the growth layer 120. The buffer layer may reduce a lattice constant between the first conductive type semiconductor layer 130 and the growth layer 120. For example, the buffer layer may include at least one selected from the group consisting of InAlGaN, GaN, AlGaN, InGaN, AlInN, AlN, and InN.

For example, the light emitting structure 145 may include the first conductive type semiconductor layer 130, the active layer 140 on the first conductive type semiconductor 130, and a second conductive type semiconductor layer on the active layer 140. The foregoing layers may be formed on the growth layer 120 using a metal organic chemical vapor deposition (MOCVD) process, a chemical vapor deposition (CVD) process, a plasma-enhanced chemical vapor deposition (PECVD) process, a molecular beam epitaxy (MBE) process, or a hydride vapor phase epitaxy (HVPE) process, but is not limited thereto.

The first conductive type semiconductor layer 130 may include only a first conductive type semiconductor layer, or may further include an undoped semiconductor layer (not shown) and a buffer layer (not shown) below the first conductive type semiconductor layer, but is not limited thereto.

For example, the first conductive type semiconductor layer 130 may be an n-type semiconductor layer. The n-type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$), e.g., include at least one selected from the group consisting of InAlGaN, GaN, AlGaN, InGaN, AlInN, AlN, and InN. Here, the n-type semiconductor layer is doped with an n-type dopant such as Si, Ge, and Sn.

Since the undoped semiconductor layer is not doped with a conductive type dopant, the undoped semiconductor layer has conductivity significantly less than that of the first conductive type semiconductor layer or the first conductive type semiconductor layer 130. Thus, the undoped semiconductor layer may be grown to improve crystallinity of the first conductive type semiconductor layer.

The active layer 140 may be disposed on the first conductive type semiconductor layer 130. In the active layer 140, electrons (or holes) injected through the first conductive type semiconductor layer 130 and electrons (or holes) injected through the second conductive type semiconductor layer 150 may be recombined with each other. Due to the recombination, light having a wavelength corresponding to that of a band gap of an energy band depending on a formation material of the active layer 140 may be emitted.

The active layer 140 may have one of a single quantum well structure, a multi quantum well (MQW) structure, a quantum wire structure, and a quantum dot structure, but is not limited thereto.

The active layer 140 may be formed of a semiconductor material having a composition formula of $In_xAl_yGa_{1-x-y}N$ ($0 \leq x \leq 1$, $0 \leq y \leq 1$, $0 \leq x+y \leq 1$). When the active layer 140 has the MQW structure, a plurality of well layers and a plurality of barrier layers may be stacked to form the active layer 140. For example, the active layer 140 may be formed of at a cycle of an InGaN well layer/GaN barrier layer, an InGaN well layer/AlGaN barrier layer, or an InGaN well layer/InGaN barrier layer. The barrier layer may have a band gap greater than that of the well layer.

A clad layer (not shown) in which an n-type or p-type dopant is doped may be disposed above/below the active layer 140. The clad layer (not shown) may include an AlGaN layer or an InAlGaN layer. The clad layer may have a band gap greater than that of the barrier layer of the active layer 140.

The second conductive type semiconductor layer 150 may be disposed on the active layer 140. For example, the second conductive type semiconductor layer 150 may be a p-type semiconductor layer in which the p-type dopant is doped. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., include at least one selected from the group consisting of InAlGaN, GaN, AlGaN, InGaN, InGaN, AlInN, AlGaAs, GaP, GaAs, GaAsP, AlGaInP, AlN, and InN. Also, the p-type semiconductor layer may be doped with a p-type dopant such as Mg, Zn, etc.

Unlike the foregoing description, the first conductive type semiconductor layer 130 may be a p-type semiconductor layer, and the second conductive type semiconductor layer 150 may be an n-type semiconductor layer. Also, an n-type semiconductor layer in which an n-type dopant is doped or a p-type semiconductor layer (not shown) in which a p-type dopant is doped may be disposed on the second conductive type semiconductor layer 150. Accordingly, the light emitting device 100 may have one of an np junction structure, a pn junction structure, an npn junction structure, and a pnp junction structure. The first conductive type semiconductor layer 130 and the second conductive type semiconductor layer 150 may have uniform or non-uniform doped concentrations of the conductive type dopant therein. That is, the light emitting structure 145 may have various structures, but is not limited thereto.

FIGS. 2 to 7 are view illustrating a process for fabricating a light emitting device using a substrate for fabricating the light emitting device according to an exemplary embodiment.

Figure 2:
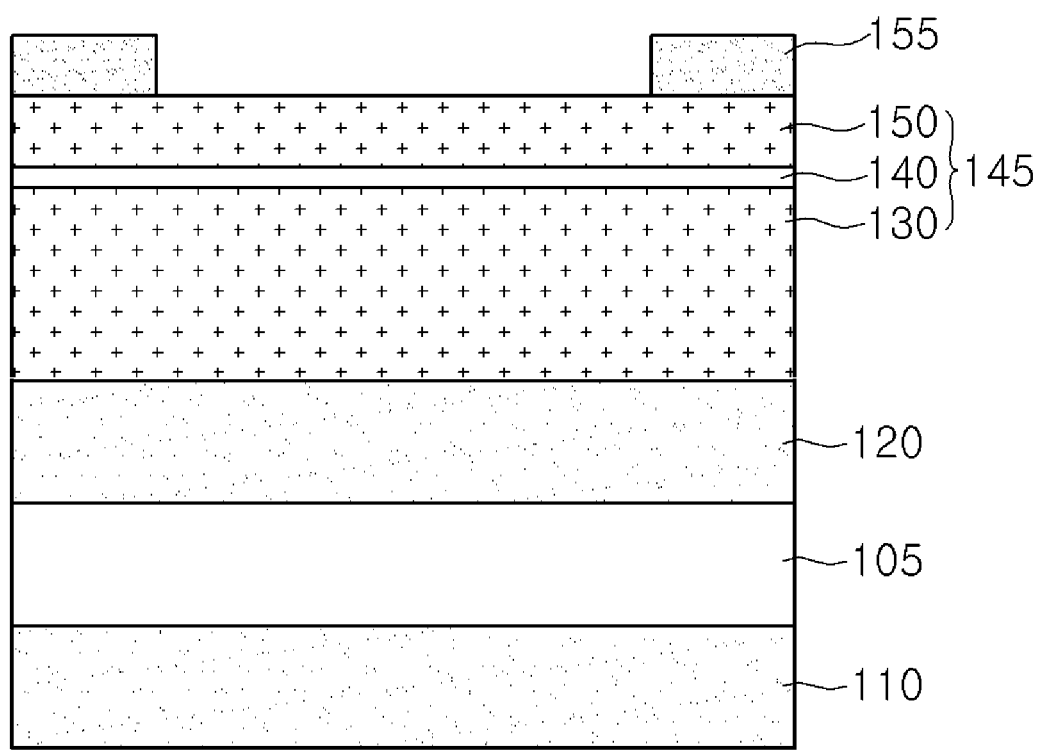
FIGS. 2 to 7 are view illustrating a process for fabricating a light emitting device using a substrate for fabricating the light emitting device according to an exemplary embodiment.

Referring to FIG. 2, a channel layer 155 may be formed on a circumference region of a top surface of a substrate for fabricating a light emitting device. The channel layer 155 may be formed using a deposition process, but is not limited thereto.

The channel layer 155 may prevent a light emitting structure 145 and an electrode (that will be formed later) from being electrically short-circuited to each other to improve reliability of the light emitting device.

The channel layer 155 may be formed of a material having insulativity, e.g., at least one selected from a group consisting of $Si_xO_y$, $Si_3N_4$, $Si_xN_y$, $SiO_xN_y$, $Al_2O_3$, and $TiO_2$.

Figure 3:
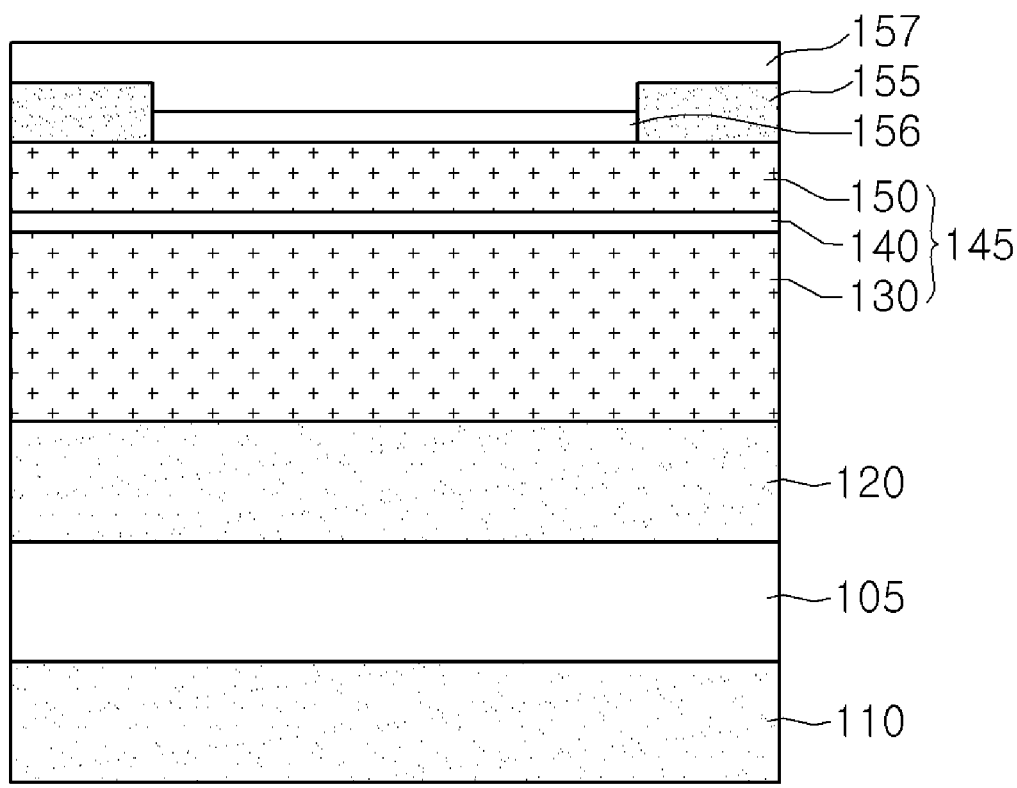

Referring to FIG. 3, an ohmic contact layer 156 may be formed on the light emitting structure 145, and a reflective layer 157 may be formed on the ohmic contact layer 156 and the channel layer 155. That is, the ohmic contact layer 156 may be formed on a top surface of the first conductive type semiconductor layer and in the inside of the channel 155.

The ohmic contact layer 156 may be formed of transparent metal oxide or metal nitride. For example, the ohmic contact layer 156 may include at least one selected from the group consisting of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au, and Ni/IrOx/Au/ITO. Alternatively, the ohmic contact layer 156 may be formed of a metal thin film having a thickness of about several nanometers to about several tens of nanometers to transmit light. In this case, the ohmic contact layer 156 may include at least one selected from the group consisting of Ni, Pt, Ir, Rh, and Ag.

The ohmic contact layer 156 may be variously changed in shape according to a design of the light emitting device, but is not limited thereto.

The reflective layer 157 may be formed on the ohmic contact layer 156 and the channel layer 155. For example, the reflective layer 157 may be formed of at least one metal of Ag, Al, Pd, Cu, and Pt or an alloy thereof.

Both the reflective layer 157 and the ohmic contact layer 156 may not be formed, or only one of the reflective layer 157 and the ohmic contact layer 156 may be formed, but is not limited thereto.

Figure 4:
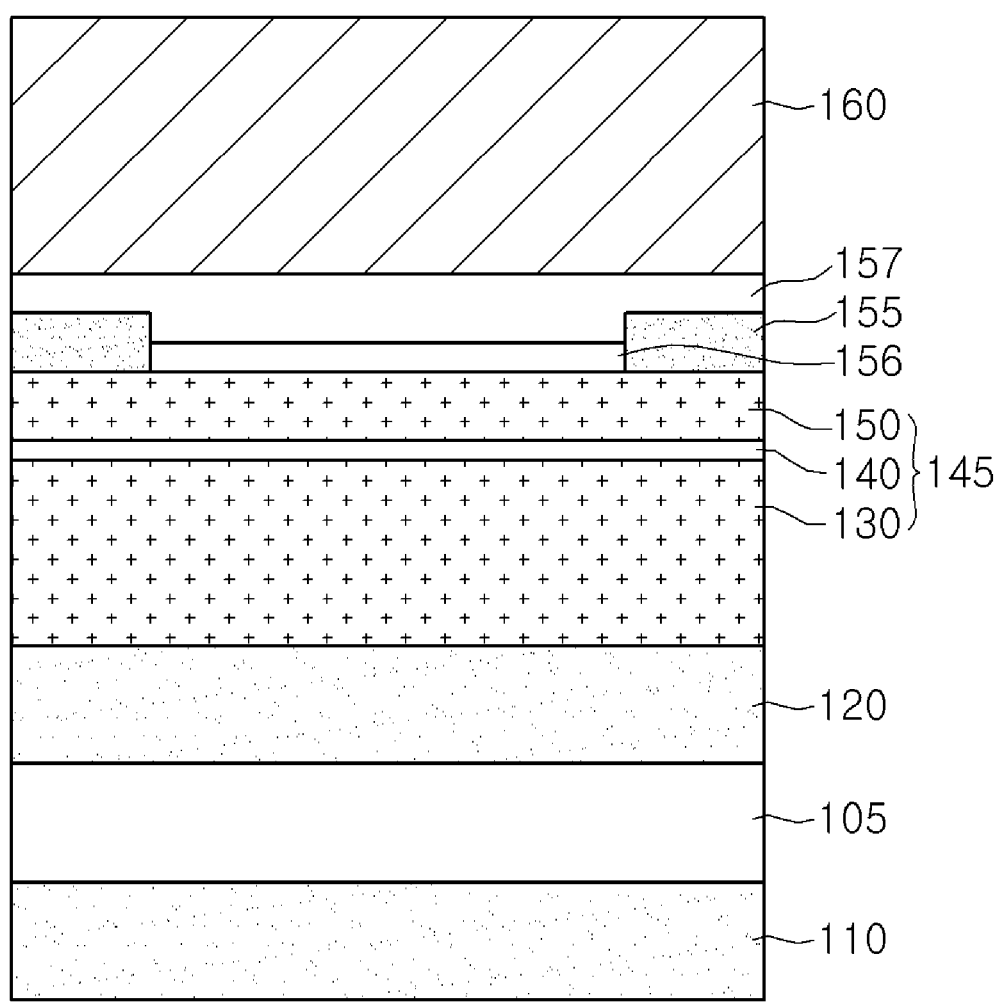

Referring to FIG. 4, a first electrode 160 may be formed on the reflective layer 157.

The first electrode layer 160 may support a plurality of layers therebelow as well as serve as an electrode.

The first electrode 160 may include at least one selected from the group consisting of Ti, Cr, Ni, Al, Pt, Au, W, Cu, and Mo, or may be a semiconductor substrate in which impurities are injected, but is not limited thereto.

The first electrode 170 may be plated and/or deposited on the light emitting structure 145 or may adhere to light emitting structure 145 in a sheet form, but is not limited thereto.

The first electrode 160 may support the light emitting structure 145. The first electrode 160 together with a second electrode (not shown) that may be formed later may supply power to the light emitting structure 145.

Figure 5:
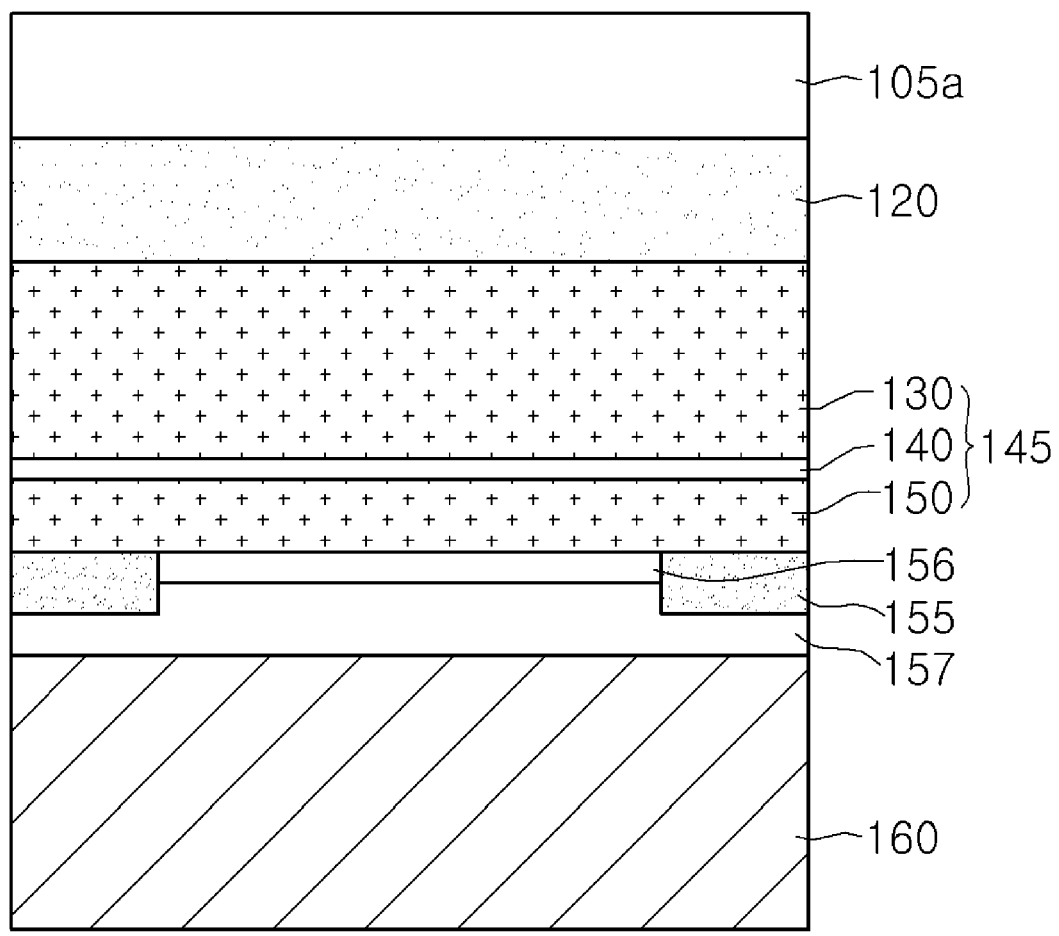

Referring to FIG. 5, the substrate 110 may be turned upside down, and then, the substrate 110 may be removed.

The substrate 110 may be removed by a laser lift off (LLO) process. Particularly, when a laser is irradiated onto a top surface of the substrate 110, a sacrificial layer 105a may be dissolved by energy of the laser. Thus, the substrate 110 may be delaminated.

Thus, to dissolve the sacrificial layer 105a by the energy of the laser, the sacrificial layer 105a should have band gap energy less than the energy of the substrate 110.

When the substrate 110 is removed, a portion of the sacrificial layer 105a may exist on a growth layer 120.

Since the growth layer 120 and the sacrificial layer 105a are disposed between the substrate 110 and the light emitting structure 145, damage of the light emitting structure 145 due to impacts generated in the substrate removing process may be minimized.

Figure 6:
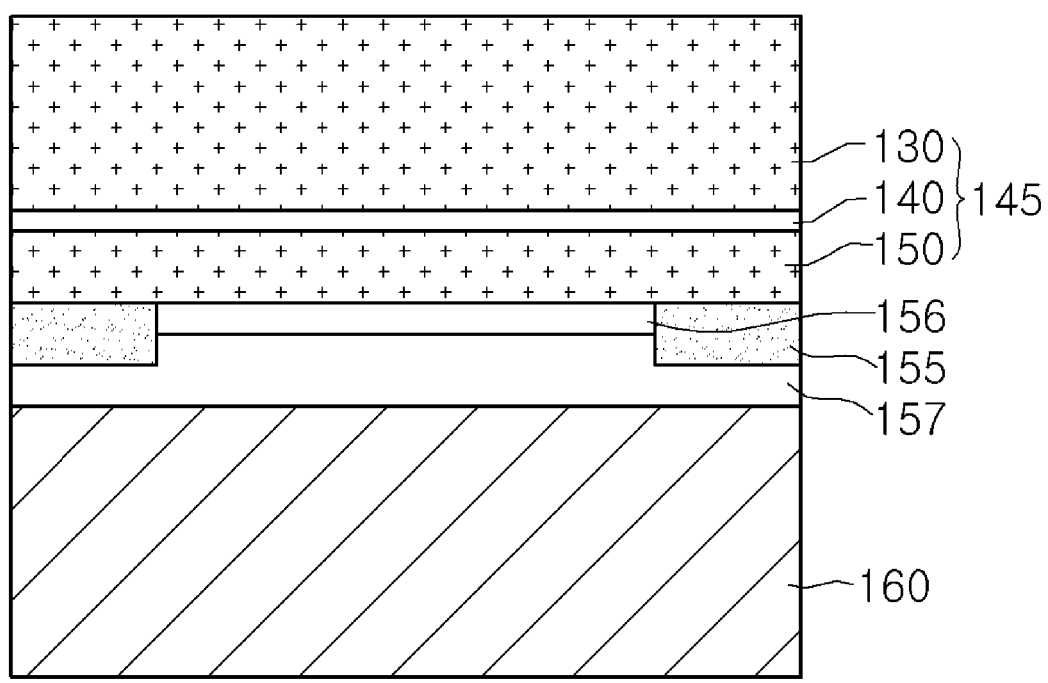

Referring to FIG. 6, a portion of the sacrificial layer 105a and the growth layer 120 may be removed.

The portion of the sacrificial layer 105a and the growth layer 120 may be removed by an etching process. Particularly, because the growth layer 120 is very thin at about 10 nm to about 100 μm, the growth layer 120 may be easily removed by the etching process.

Figure 7:
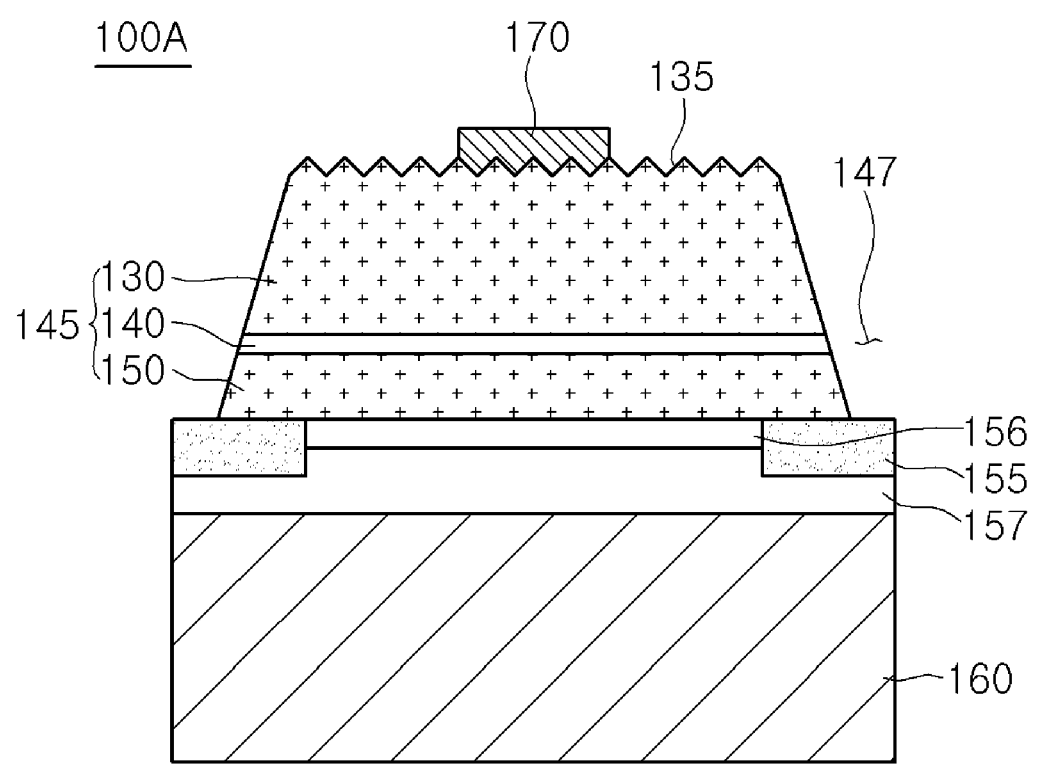

Referring to FIG. 7, an isolation etching process may be performed on the light emitting structure 145 along a boundary region 147 to expose the channel layer 155. The light emitting structure may have a mesa shape by the etching process. Sequentially, the second electrode 170 may be formed on the light emitting structure 145, particularly, a portion of the first conductive type semiconductor layer 130 to manufacture a light emitting device 100A having a vertical type electrode structure.

A plurality of light emitting devices 100A may be separated from each other by the isolation etching process.

The second electrode 170 may have a single- or multi-layered structure at least one selected from the group consisting of Ti, Cr, Ni, Al, Pt, Au, W, Cu, and Mo, but is not limited thereto. The second electrode 170 may be formed using a deposition or plating process.

Roughness or unevenness patterns 135 may be formed on a top surface of the first conductive type semiconductor layer 130 of the light emitting structure 145 to improve light extraction efficiency. Each of the roughness or unevenness patterns 135 may have a random shape, or the roughness or unevenness patterns 135 may have a predetermined distance therebetween.

Figure 8:
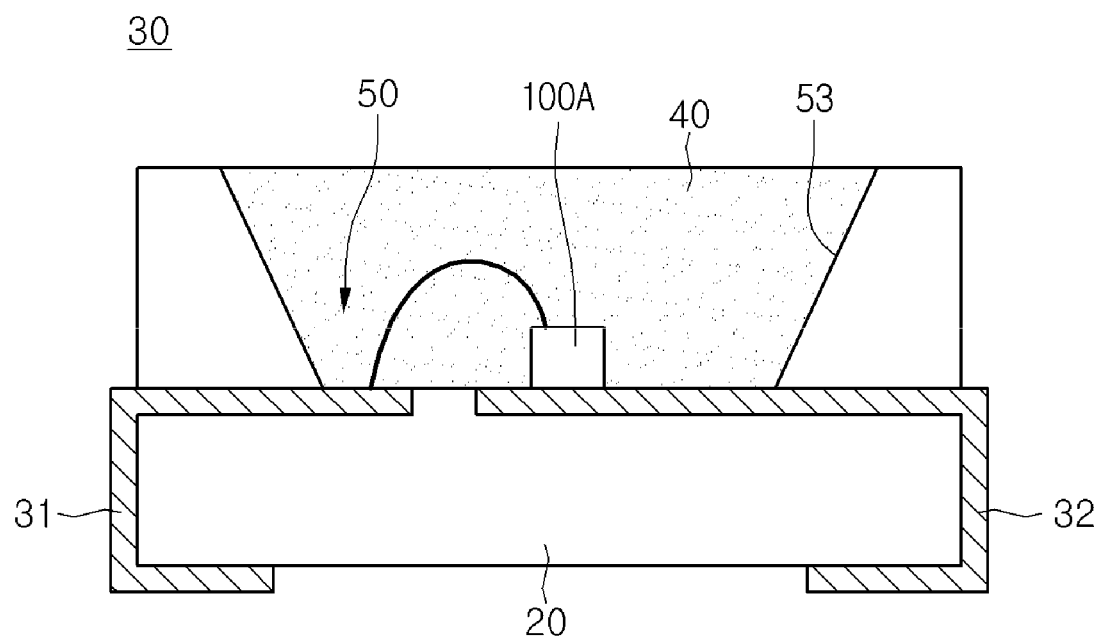
FIG. 8 is a sectional view of a light emitting device package including a light emitting device according to an exemplary embodiment.

FIG. 8 is a sectional view of a light emitting device package including a light emitting device according to an exemplary embodiment.

Referring to FIG. 8, a light emitting device package 30 according to an exemplary embodiment includes a package body 20, first and second lead electrodes 31 and 32 disposed on at least top surface and a circumference of a lateral surface of the package body 20, a light emitting device 100A according to an exemplary embodiment, which is disposed on the first and second lead electrodes 31 and 32 on the package body 20 and electrically connected to the first and second lead electrodes 31 and 32, and a molding member 40 surrounding the light emitting device 100A.

The package body 20 may be formed of a silicon material, a synthetic resin material, or a metal material. Also, when viewed from an upper side, the package body 20 has a cavity 50 having an inclined surface 53.

The first and second lead electrodes 31 and 32 are electrically separated from each other and supply power to the light emitting device 100A. Also, the first and second lead electrodes 31 and 32 may serve as reflective plates, which reflect light generated in the light emitting device 100A to improve light efficiency and heatsink plates, which discharge heat generated in the light emitting device 100A to the outside.

The second lead electrode 32 may pass through the package body 20. Although the second lead electrode 32 passes through the package body 20 in the drawings, the first lead electrode 31 instead of the second lead electrode 32 may pass through the package body 20. Since this may be varied according to an electrode structure of the light emitting device 100A, the present disclosure is not limited thereto.

The light emitting device 100A may be disposed on the package body 20 or any one of the first and second lead electrodes 31 and 32.

The light emitting device 100A may be electrically connected to one of the first and second lead electrodes 31 and 32 using a flip-chip or die bonding method. For example, a first electrode 141 of the light emitting device 100A may be electrically connected to the second lead electrode 32, and a second electrode 142 of the light emitting device 100A may be electrically connected to the first electrode 31.

The molding member 40 may surround the light emitting device 100A. The molding member 40 may contain a phosphor to vary a wavelength of light emitted from the light emitting device 100A.

The light emitting device package 30 may mount at least one or the plurality of the above-described light emitting devices 100A, but is not limited thereto.

The light emitting device package 30 may have a chip on board (COB) type. That is, according to the COB type, the package body 20 may have a flat top surface, and the plurality of light emitting devices 100A may be disposed on the package body 20.

The light emitting device or the light emitting device package according to an exemplary embodiment may be applied to a light unit. The light unit has a structure in which a plurality of light emitting devices or light emitting device packages is arrayed. Thus, the light unit may include a display device illustrated in FIGS. 9 and 10 and a lighting device illustrate in FIG. 11. In addition, the light unit may include illumination lamps, traffic lights, vehicle headlights, and signs.

Figure 9:
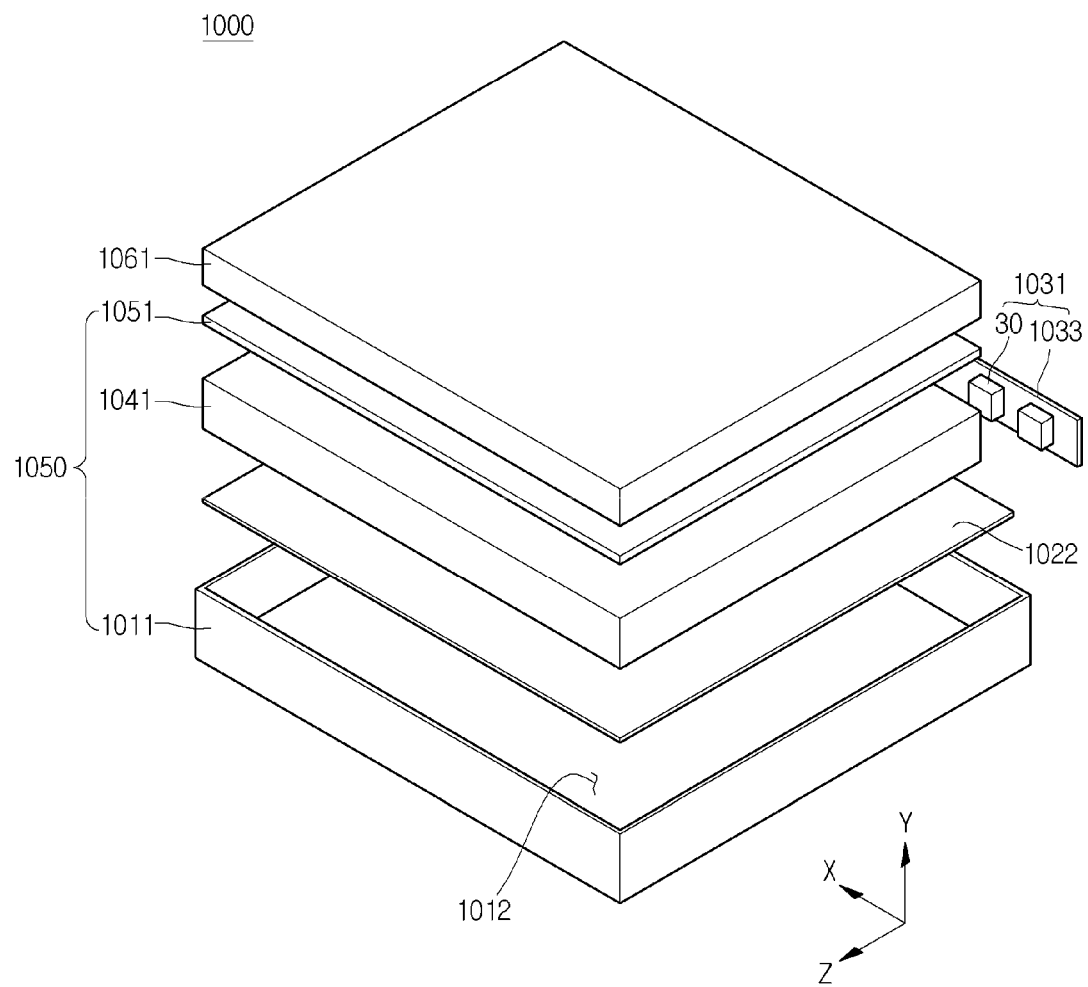
FIG. 9 is an exploded perspective view of a display device according to an exemplary embodiment.

FIG. 9 is an exploded perspective view of a display device according to an exemplary embodiment.

Referring to FIG. 9, a display unit 1000 may include a light guide plate 1041, a light emitting module 1031 providing light to the light guide plate 1041, a reflective member 1022 below the light guide plate 1041, an optical sheet 1051 above the light guide plate 1041, a display panel 1061 above the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041 may be defined as the light unit 1050.

The light guide plate 1041 diffuses light supplied from the light emitting module 1031 to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 is disposed on at least one lateral surface of the light guide plate 1041 to provide light to the at least one lateral surface of the light guide plate 1041. Thus, the light emitting module 1031 may be used as a light source of a display device.

At least one light emitting module 1031 may be disposed on one lateral surface of the light guide plate 1041 to directly or indirectly provide light. The light emitting module 1031 may include a substrate 1033 and the light emitting device packages 30 according to the embodiment. The light emitting device packages 30 may be arrayed by a predetermined distance on the substrate 1033. The substrate 1033 may be a printed circuit board (PCB), but is not limited thereto. Also, the substrate 1033 may include a metal core PCB or a flexible PCB, but is not limited thereto. When the light emitting device packages 30 are mounted on a lateral surface of the bottom cover 1011 or on a heatsink plate, the substrate 1033 may be removed. Here, a portion of the heatsink plate may contact a top surface of the bottom cover 1011. Thus, heat generated in the light emitting device package 30 may be discharged into the bottom cover 1011 via the heatsink plate.

The plurality of light emitting device packages 30 may be mounted to allow a light emitting surface through which light is emitted onto the substrate 1033 to be spaced a predetermined distance from the light guide plate 1041, but is not limited thereto. The light emitting device packages 30 may directly or indirectly provide light to a light incident surface that is a side of the light guide plate 1041, but is not limited thereto.

The reflective member 1022 may be disposed below the light guide plate 1041. Since the reflective member 1022 reflects light incident onto an under surface of the light guide plate 1041 to supply the light to the display panel 1061, brightness of the display panel 1061 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover (not shown), but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel, and include first and second substrates formed of a transparent material and a liquid crystal layer between the first and second substrates. A polarizing plate may be attached to at least one surface of the display panel 1061. The present embodiment is not limited to the attached structure of the polarizing plate. The display panel 1061 transmits or blocks light provided from the light emitting module 1031 to display information. The display unit 1000 may be applied to various portable terminals, a monitor for a notebook computer, a monitor for a laptop computer, television, etc.

The optical sheet 1051 is disposed between the display panel 1061 and the light guide plate 1041 and may include at least one transmission sheet. For example, the optical sheet 1051 may include at least one of a diffusion sheet, a horizontal or vertical prism sheet, a brightness enhancement sheet, etc. The diffusion sheet diffuses incident light, and the horizontal or/and vertical prism sheet collects the incident light into a display region. In addition, the brightness enhancement sheet reuses lost light to improve the brightness. Also, a protection sheet may be disposed on the display panel 1061, but is not limited thereto.

Optical members such as the light guide plate 1041 and the optical sheet 1051 may be disposed on an optical path of the light emitting module 1031, but is not limited thereto.

Figure 10:
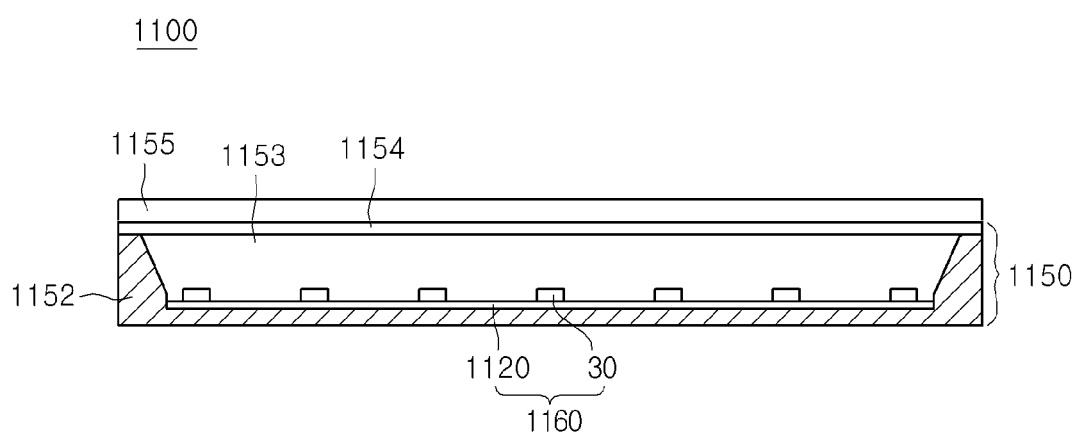
FIG. 10 is a view of a display device according to an exemplary embodiment.

FIG. 10 is a view of a display device according to an exemplary embodiment.

Referring to FIG. 10, a display unit 1100 may include a bottom cover 1152, a substrate 1120 on which the above-described light emitting device packages 30 are arrayed, an optical member 1154, and a display panel 1155.

The substrate 1120 and the light emitting device package 30 may be defined as a light emitting module 1060. The bottom cover 1152, the at least one light emitting module 1060, and the optical member 1154 may be defined as a lighting unit.

The bottom cover 1152 may include a receiving part 1153, but is not limited thereto.

The optical member 1154 may include at least one of a lens, a light guide plate, a diffusion sheet, horizontal and vertical prism sheets, and a brightness enhancement sheet. The light guide plate may be formed of a PC material or PMMA material. In this case, the light guide plate may be removed. The diffusion sheet diffuses incident light, and the horizontal and vertical prism sheets collect the incident light into the display panel 1155. The brightness enhancement sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 11:
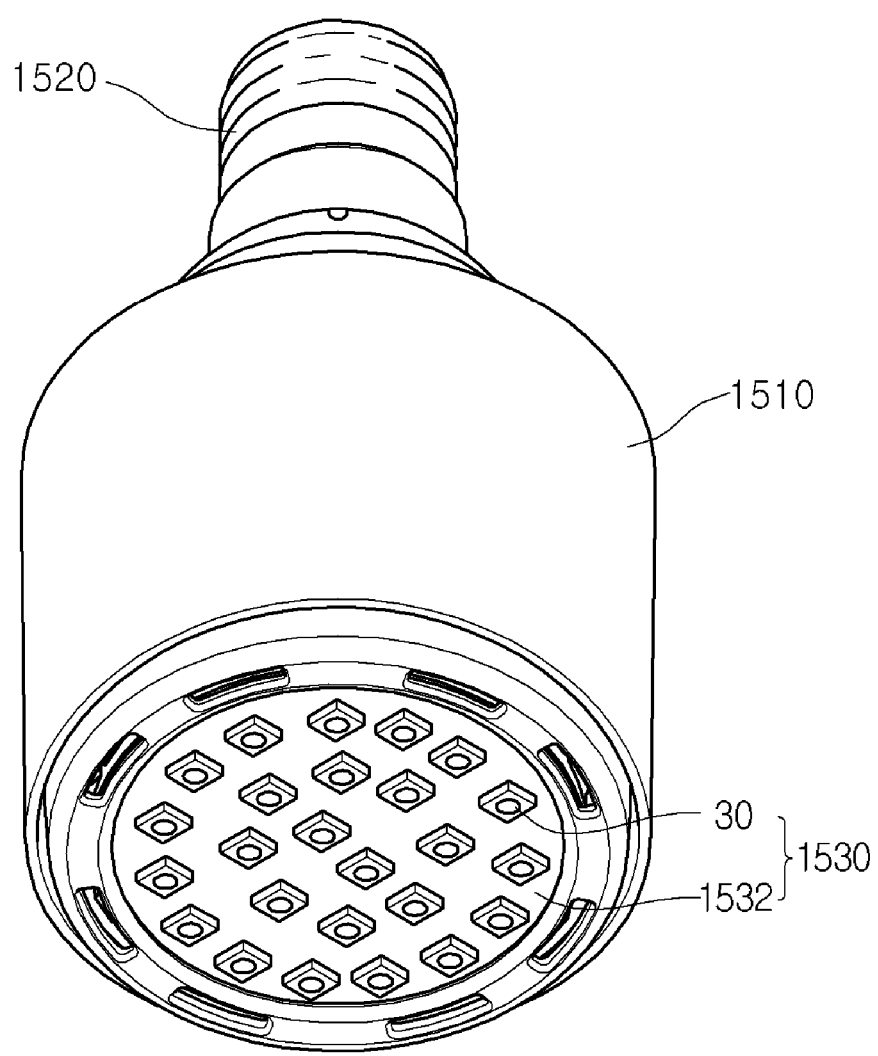
FIG. 11 is a perspective view of a lighting device according to an exemplary embodiment.

FIG. 11 is a perspective view of a lighting device according to an exemplary embodiment.

Referring to FIG. 22, the lighting unit 1500 may include a case 1510, a light emitting module 1530 in the case 1510, and a connection terminal 1520 disposed in the case 1510 to receive an electric power from an external power source.

The case 1510 may be preferably formed of a material having good heat shielding characteristics, for example, a metal material or a resin material.

The light emitting module 1530 may include a substrate 1532 and a light emitting device package 30 mounted on the substrate 1532. The light emitting device package 30 may be provided in plurality, and the plurality of light emitting device packages 30 may be arrayed in a matrix shape or spaced a predetermined distance from each other.

The substrate 1532 may be an insulator substrate on which a circuit pattern is printed. For example, the substrate may include a general printed circuit board (PCB), a metal core PCB, a flexible PCB, a ceramic PCB, FR-4, etc.

Also, the substrate 1532 may be formed of a material to efficiently reflect light, and a surface thereof may be formed in a color capable of efficiently reflecting light. For example, the substrate may be a coated layer having a white color or a silver color.

The at least one light emitting device packages 30 may be mounted on the substrate 1532. Each of the light emitting device packages 30 may include at least one light emitting diode (LED) chip. The LED chip may include a color LED emitting red, green, blue or white light, and a UV LED emitting ultraviolet (UV) rays.

The light emitting module 1530 may have a combination of several light emitting device packages 30 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

According to the embodiments, since the sacrificial layer having the band gap energy less than the energy of the substrate used for removing the substrate is disposed on the substrate, the sacrificial layer may be dissolved by the energy of the laser to easily lift-off the substrate.

According to the embodiments, the growth layer may be disposed between the sacrificial layer and the light emitting structure to minimize the impacts generated by the LLO process and transmitted to the light emitting structure, thereby improving the reliability of the fabrication process.

According to the embodiments, the growth layer may be disposed between the sacrificial layer and the light emitting structure to completely remove the portion of the sacrificial layer remaining after the lift off process of the substrate due to the removal of the growth layer, thereby improving the reliability of the fabrication process.

According to the embodiments, since the growth layer is heat-treated to form a single crystalline structure, the light emitting structure may be easily manufactured.

According to the embodiments, since the growth layer has a thickness of about 10 nm to about 100 μm, the growth layer may be easily removed by the etching process that is a post-process.

According to the embodiments, the top surface of the growth layer may be patterned. Also, the buffer layer may be disposed on the growth layer to ease manufacturing the light emitting structure.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses may also be apparent to those skilled in the art.

What is claimed is:

1. A method for fabricating a light emitting device, the method comprising:
    forming a sacrificial layer having band gap energy less than energy of a substrate on the substrate;
    forming a growth layer on the sacrificial layer;
    forming a light emitting structure comprising a first conductive type semiconductor layer, an active layer, and a second conductive type semiconductor layer on the growth layer; and
    irradiating the laser onto the sacrificial layer passing through the substrate, thereby to lift-off the substrate, wherein the growth layer is formed of the same material as that of the substrate.

2. The method of claim 1, further comprising removing the growth layer using an etching process after the substrate is lift-off.

3. The method of claim 1, further comprising forming a first electrode on the light emitting structure.

4. The method of claim 2, further comprising forming a second electrode on the first conductive type semiconductor layer exposed by removing the growth layer.

5. The method of claim 1, wherein the substrate is formed of sapphire having a single crystalline structure, and the growth layer is formed of sapphire having a poly crystalline structure.

6. The method of claim 1, wherein the sacrificial layer has a band gap of about 1.0 eV to about 7.0 eV.

7. The method of claim 1, wherein the sacrificial layer includes at least one selected from the group including ITO, MoxOy, WxOy, NiOx, TiOx, MN, and GaN.

8. The method of claim 1, wherein the sacrificial layer has a thickness of about 10 nm to about 100 μm.

9. The method of claim 1, further comprising patterning a top surface of the growth layer after the growth layer is formed.

10. The method of claim 1, further comprising forming a buffer layer on the growth layer after the growth layer is formed.

11. A substrate for fabricating a light emitting device, the substrate comprising:
a substrate;
a sacrificial layer having band gap energy less than energy of the substrate used for removing the substrate;
a growth layer on the sacrificial layer; and
a light emitting structure comprising a first conductive type semiconductor layer, an active layer, and a second conductive type semiconductor layer on the growth layer,
wherein the growth layer is formed of the same material as that of the substrate.

12. The substrate of claim 11, wherein the sacrificial layer has a band gap of about 1.0 eV to about 7.0 eV.

13. The substrate of claim 11, wherein the substrate is formed of sapphire having a single crystalline structure, and the growth layer is formed of sapphire having a poly crystalline structure.

14. The substrate of claim 11, wherein the sacrificial layer includes at least one selected from the group including ITO, MoxOy, WxOy, NiOx, TiOx, MN, and GaN.

15. The substrate of claim 11, wherein the sacrificial layer has a thickness of about 10 nm to about 100 μm.

16. The substrate of claim 11, wherein the growth layer has a top surface including a pattern structure.

\* \* \* \* \*